United States Patent [19]
Essbaum et al.

[11] Patent Number: 5,814,846
[45] Date of Patent: Sep. 29, 1998

[54] CELL APPARATUS AND METHOD FOR USE IN BUILDING COMPLEX INTEGRATED CIRCUIT DEVICES

[75] Inventors: Alexander Dankwart Essbaum; Brian Allan Zoric, both of Austin, Tex.

[73] Assignee: International Business Machines Corporation, Armonk, N.Y.

[21] Appl. No.: 726,719

[22] Filed: Oct. 7, 1996

[51] Int. Cl.$^6$ ........................ H01L 23/528; H01L 27/118; H01L 29/41
[52] U.S. Cl. ........................ 257/207; 257/208; 257/206; 257/210; 257/401; 257/909
[58] Field of Search .................... 257/204, 206, 257/207, 208, 210, 401, 923, 909

[56] References Cited

U.S. PATENT DOCUMENTS

| | | | |
|---|---|---|---|
| 3,747,064 | 7/1973 | Thompson | 307/205 |
| 4,017,741 | 4/1977 | Briggs | 307/221 C |
| 4,855,958 | 8/1989 | Ikeda et al. | 257/923 |
| 5,119,314 | 6/1992 | Hotta et al. | 257/206 |
| 5,399,921 | 3/1995 | Dobbelaere | 326/113 |
| 5,440,182 | 8/1995 | Dobbelaere | 326/38 |
| 5,455,521 | 10/1995 | Dobbelaere | 376/17 |

FOREIGN PATENT DOCUMENTS

| | | | |
|---|---|---|---|
| 5-55531 | 3/1993 | Japan | 257/206 |

*Primary Examiner*—Jerome Jackson
*Attorney, Agent, or Firm*—Anthony V. S. England; Kermit D. Lopez; Andrew J. Dillon

[57] ABSTRACT

A cell apparatus and method for use in building complex integrated circuit devices. The cell apparatus and method for use in building complex integrated circuits includes a cell which has regions dedicated to specific types of circuit elements and a method for designing the cell. A first region within the cell is dedicated to a first type of circuit element. A second region within the cell is dedicated to a second type of circuit element. A third region is dedicated to one or more diverse types of integrated circuit elements for utilization in multiple diverse applications of integrated circuits. The cell can be utilized in conjunction with multiple cells to efficiently form an image representing a complex integrated circuit device. The cell includes an upper edge and a lower edge, a plane dedicated to a ground line, a plane dedicated to a clock line, and a plane dedicated to a voltage supply line. The first region within the cell can specifically be dedicated to n-type transistors and the second region to p-type transistors. A central region located within the cell divides the first region and the third region from the second region. The cell can be duplicated multiple times to build a library of dynamic logic cells such as those used in integrated circuit macros.

6 Claims, 2 Drawing Sheets

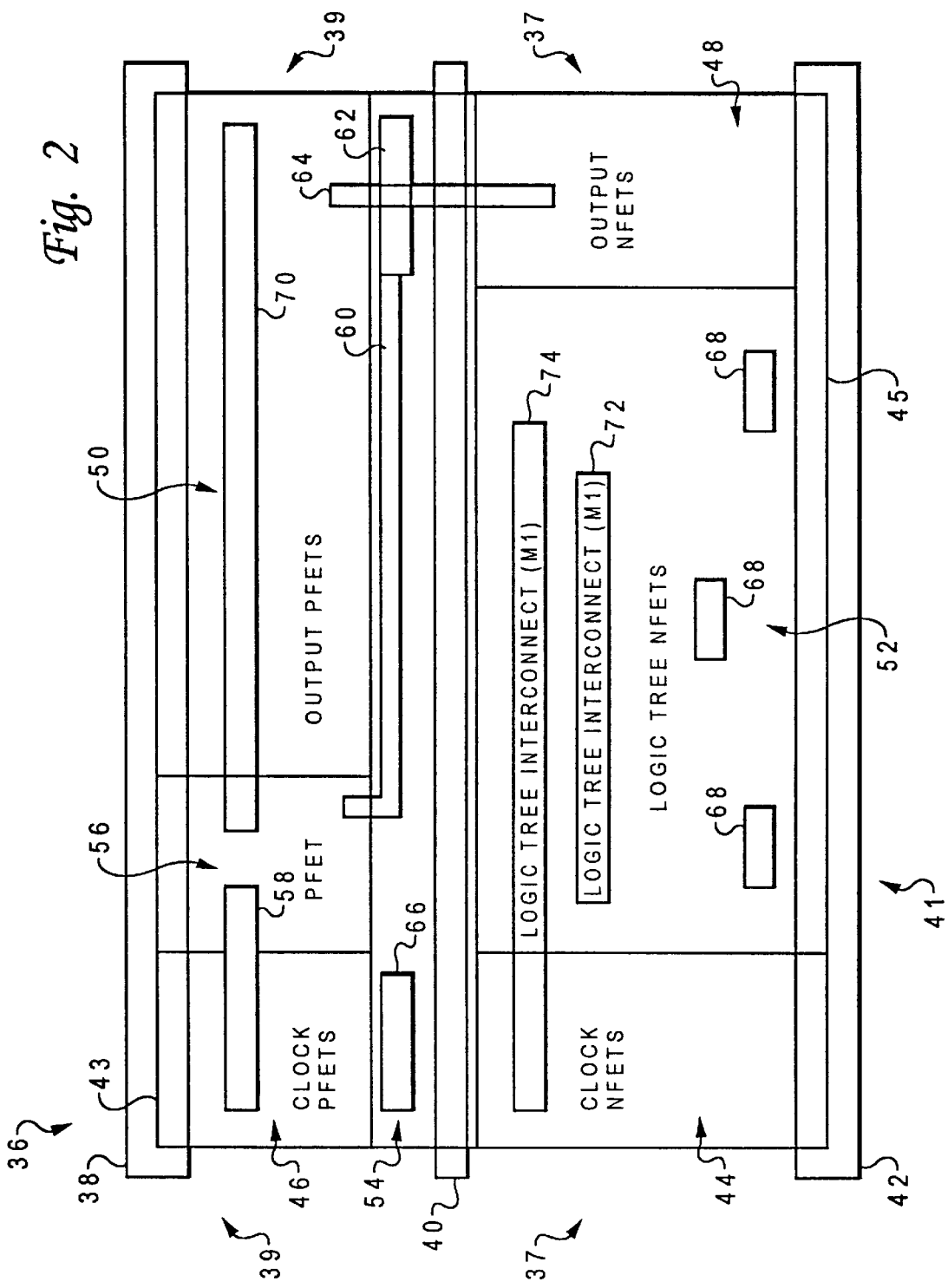

CELL APPARATUS AND METHOD FOR USE IN BUILDING COMPLEX INTEGRATED CIRCUIT DEVICES

BACKGROUND OF THE INVENTION

1. Technical Field:

The invention relates in general to integrated circuit technology and more particularly to the design of very large scale integrated circuits. Still more particularly the invention relates to the layout of dynamic cell transistors in a space efficient and wireable fashion, allowing for a greater number of transistors in a limited area and additionally providing shielding for noise-sensitive internal nodes utilized in dynamic logic circuits.

2. Description of the Related Art:

Layout of dynamic logic cells in a space-efficient and wireable fashion is a goal sought by designers of very large scale integrated circuits. In the design of integrated circuits utilizing dynamic logic cells, it is highly desirable to employ circuits having a minimal number of active devices per stage. This reduces the cost of dynamic logic circuits, when realized in integrated circuit form, and results in higher packing density in view of the reduced area occupied per stage.

It is well-known that complex logic functions can be implemented with shorter latency and smaller layout area by using dynamic logic rather than static logic. A well-known example of a technique utilizing dynamic logic is DOMINO. This technique employs clocked transistors for precharging, a pull-down network having signal inputs, a clock input for discharging, and an inverter for buffering and inverting an output signal. Due to the inversion of the output signal, it is possible to feed the output of such a DOMINO logic circuit to the input of another DOMINO logic circuit, and multiple logic levels can be connected for computation during the same evaluation clock phase.

DOMINO logic circuits use MOS (metal oxide silicon) transistors in their evaluation networks, resulting in a small layout available for design.

DOMINO logic circuits are principally utilized for the implementation of non-inverting logic functions reduced to a combination of AND, OR, OR/AND or AND/OR gates.

An advantage of DOMINO logic is that it can be used to implement multiple levels of logic during a single evaluation clock phase very quickly, while still maintaining an acceptable noise immunity on intermediate nodes. This is partly due to the use of inverters between logic stages. It is the inverter trip point that determines the noise margin, and not the threshold of individual transistors.

A MOS structure utilized in DOMINO logic circuits is created by superimposing several layers of conducting, insulating, and transistor forming materials. After a series of processing steps, a typical structure might consist of levels of diffusion, polysilicon, and metal that are separated by insulating layers. A first layer of metal can be referred to as M1, a second layer of metal as M2, and so forth.

MOS technology provides two types of transistors, an n-type transistor (nMOS) and a p-type transistor (pMOS). These are fabricated in silicon by using either negatively doped silicon that is rich in electrons (negatively charged) or positively doped silicon that is rich in holes (the dual of electrons and positively charged).

For the n-transistor, the structure consists of a section of p-type silicon separating two diffused areas of n-type silicon. The area separating the n regions is capped with a sandwich consisting of an insulator and a conducting electrode called the gate. Similarly, for the p-transistor the structure consists of a section of n-type silicon separating two p-type diffused areas. The p-transistor also has a gate electrode. An example of a MOS transistor is a field effect transistor (FET). The three terminals of a FET are known as the drain, source and gate.

Heavily doped n-type source and drain regions are fabricated in a p-type substrate (often called the body). A thin layer of silicon dioxide can be grown over the substrate material and a conductive gate material (metal or polycrystalline silicon) covers this oxide between source and drain. The gate-source voltage is used to modify the conductance of the region under the gate. This allows the gate voltage to control the current flowing between source and drain, giving switching characteristics in digital circuits.

Standard VLSI (Very Large Scale Integrated) circuit design techniques begin with the layout of a cell structure. The cell structure is an image of a circuit with representations of circuit elements such as transistors, connecting lines, ground lines, and clock lines. A typical circuit cell image has the following general characteristics: 1. Logic circuits are laid out in parallel columns so that diffusions run horizontally and metal interconnections can be either horizontal or vertical over the circuits. 2. Clock phase lines run horizontally along the center of the cell image. 3. Regions within the cell are reserved for specific circuit elements and additional vertical and horizontal columns represent connections to the clock phase lines and the ground and voltage supply lines.

When creating standard cell designs, geometric regularity is often required while maintaining common electrical characteristics between cells in a cell library. A common physical limitation is to fix the physical height of the cell and vary the width according to the function. A typical standard cell is composed of a row of n-transistors of maximum height, and a row of p-transistors of maximum height, separated by a given distance. Power (VDD) and ground (GND) busses traverse the cell at the top and bottom. The internal area of the cell is used for routing the transistors to specific gates.

Difficulties arise in the design of space efficient CMOS complementary metal oxide silicon) DOMINO logic circuits. Cells are typically designed with a specific function in mind (e.g., an AND or OR function) and are reproduced multiple times to create a macro, such as a microprocessor design utilized in manufacturing microprocessor chips. A library of multiple dynamic logic cells is utilized to build such a macro.

However, designing such a library in a space-efficient and wireable fashion is difficult. VDD and GND busses must be shared on the top and bottom edges of such a cell and a full horizontal wiring channel must be reserved for a clock prewire, since all cells will ultimately be wired to a clock line. A cell arrangement and structure for a dynamic logic cell, such as those utilized in DOMINO logic circuits, which is space-efficient and arranged in a wireable fashion is a goal sought by modern VLSI designers.

Additionally, a cell design which provides significant noise shielding for noise-sensitive internal nodes of a dynamic logic circuit is an important consideration.

SUMMARY OF THE INVENTION

It is therefore an object of the invention to provide for an integrated circuit technology.

It is another object of the invention to provide an integrated circuit technology for the design of very large scale integrated circuits.

It is still another object of the invention to provide for the layout of dynamic cell transistors utilized in integrated circuit in a space efficient and wireable fashion, allowing for a greater number of transistors in a limited area.

It is yet another object of the invention to provide a cell image structure that allows for shielding of noise-sensitive internal nodes utilized in dynamic logic circuits.

The above and other objects are achieved as is now described. A cell apparatus and method for use in building complex integrated circuit devices is disclosed. The cell apparatus and method for use in building complex integrated circuit devices includes a cell which has regions dedicated to specific types of circuit elements and a method for designing the cell. A first region within the cell is dedicated a first type of circuit element. A second region within the cell is dedicated to a second type of circuit element. A third region is dedicated to one or more diverse types of integrated circuit elements for utilization in multiple diverse applications of integrated circuits. The cell can be utilized in conjunction with multiple cells to efficiently form an image representing a complex integrated circuit device. The cell includes an upper edge and a lower edge, a plane dedicated to a ground line, a plane dedicated to a clock line, and a plane dedicated to a voltage supply line.

The first region within the cell can be specifically dedicated to n-type transistors and the second region within the cell to p-type transistors. A central region located within the cell divides the first region and the third region from the second region. The cell can be duplicated multiple times to build a library of dynamic logic cells such as those used in integrated circuit macros.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings wherein:

FIG. 2 is a schematic of a cell which implements a domino logic circuit incorporating a latching gate.

DETAILED DESCRIPTION OF PREFERRED EMBODIMENT

Figure 1:
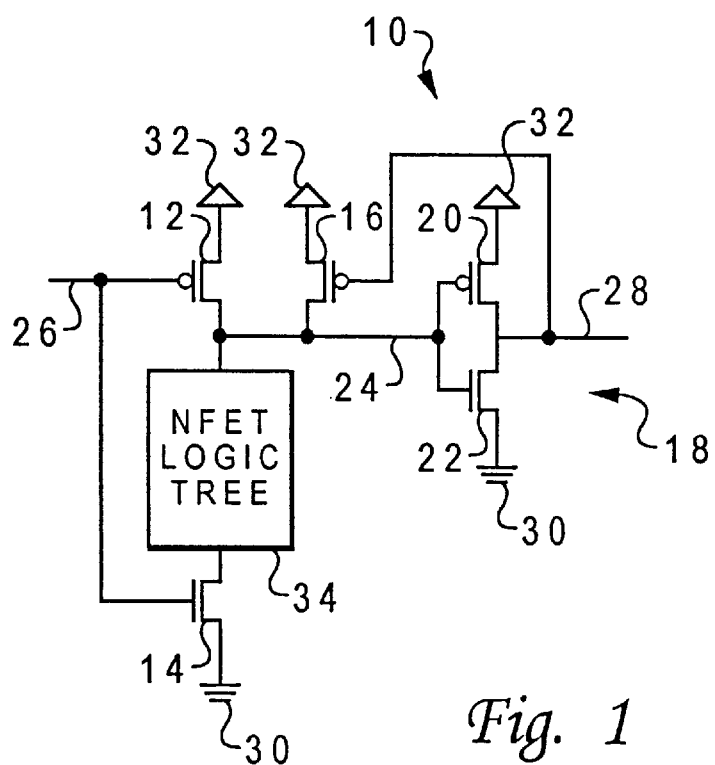
FIG. 1 is a schematic diagram of a domino logic circuit incorporating a latching gate.

With reference now to the figures and in particular with reference to FIG. 1, a schematic diagram of a domino logic circuit 10 which may be utilized in accordance with the present invention is depicted.

The domino logic circuit 10 includes a configuration of p-type and n-type transistors. A pFET clock transistor 12 and an nFET clock transistor 14 are connected electrically to a logic tree 34, which includes one or more diverse types of integrated circuit elements for utilization in multiple diverse applications of integrated circuits. Logic tree 34 incorporates nFET transistors to perform logic functions such as AND, OR, AO, OA, etc. The clock pFET transistor 12 is typically about half the size of the clock nFET transistor 14, and the clock nFET transistor 14 slightly larger than the nFET transistors of logic tree 34. Pull-up nFET transistor 16 is typically small, while inverter pFET transistor 20 is typically large. Inverter nFET transistor 22 is sized similar to the nFET transistors of logic tree 34. Inverter nFET transistor 22 and inverter pFET transistor 20 are coupled to form an inverter 18.

Clock pFET transistor 12, pull-up pFET transistor 16 and inverter pFET transistor 20 are tied to voltage supply (VDD) 32. Clock nFET transistor 14, and inverter nFET transistor 22 are tied to ground (GND) 30. Clock nFET transistor 14 and clock PFET transistor 12 are also coupled with clock 26. Clock 26 generates multiphase clock pulses that provide timing and control for internal circuit functions, such as those functions associated with nFETs of logic tree 34. Logic tree 34 also has input lines (not shown). Circuit output results at output 28. Internal node 24 connects the inverter 18 with logic tree 34, clock pFET transistor 12 and pull-up pFET transistor 16. Inverter 18 functions to convert an x signal input into an x' output. For example, when there is a '0' on the inverter input, there is a '1' at the inverter output.

Domino logic circuit 10 represents a typical stage utilized in CMOS domino logic designs. Domino logic circuit 10 is a latching version of CMOS domino logic, well-known in the art of integrated circuit devices. Domino logic circuit 10 is made latching by placing a weak p feedback transistor such as pull-up transistor 16 within the circuit.

FIG. 2 illustrates a cell 36 which implements domino logic circuit 10 of FIG. 1. Cell 36 is divided into regions dedicated to specific types of integrated circuit elements. FIG. 2 depicts cell 36 having three regions dedicated to specific functions. A first region 37 of cell 36 includes integrated circuit elements associated with n-type transistors such as nFET transistors. A second region 39 of cell 36 includes integrated circuit elements associated with p-type transistors such as pFET transistors. A third region 41 is also associated with nFET type transistors. Third region 41, although surrounded by first region 37 and also dedicated to nFET type transistors, is independent of first region 37. Third region 41 is dedicated to diverse types of integrated circuit elements for utilization in multiple diverse integrated circuit applications. For example, nFETs located in third region 41 may be arranged to form AND or OR gates. Third region 41 is not limited to a single type of integrated circuit element or configuration.

A variety of bus lines run horizontally across the length of cell 36. A plane 38 dedicated to VDD is located along the upper edge 43 of cell 36. Plane 38 is tied to diffusion regions (not shown) within the second region 39 of cell 36 on both the left and right sides of cell 36. A plane 40 dedicated to a clock is located within a central region 54 of cell 36 and extends the length of central region 54 and cell 36. A plane 42 dedicated to GND is located along the lower edge 45 of cell 36 and extends the length of cell 36. Plane 42 is also tied to diffusion regions (not shown) within first region 37 and third region 41 on both the left and right sides of cell 36.

First region 37 of cell 36 includes a region 44 dedicated to a clock nFET transistor and a region 48 dedicated to an inverter nFET transistor. Second region 39 includes a region 46 dedicated to a clock pFET transistor, a region 56 dedicated to a pull-up pFET transistor, and a region dedicated to an inverter pFET transistor. Transistor images within each region of cell 36 follow the electrical schematic of domino logic circuit 10 of FIG. 1. For example, the regions dedicated to nFET and pFET inverter transistors form a general region dedicated to a single inverter, which is analogous to inverter 18 of FIG. 1.

Third region 41 of cell 36 includes a region 52 dedicated to diverse types of integrated circuit elements for utilization in multiple diverse applications which allow the cell to be utilized in conjunction with multiple cells to efficiently form a complex integrated circuit device image. Third region 41 of cell 36 is dedicated specifically to an interchangeable logic tree arrangement. Depending upon a desired application for a given integrated circuit design, the logic tree may include varying arrangements of nFETs to perform logic functions such as AND, OR, AND/OR or OR/AND. Thus, the third region 41 is an open region, allowing different logic functions to be used in conjunction with the other cell regions. The images of nFETs found in the third region, which form the logic tree, include areas 68 dedicated to input pins of the logic tree nFETs.

A variety of connecting planes traverse the cell. A plane 58 dedicated to a first internal node runs horizontally between region 46 dedicated to a clock pFET transistor and region 56 dedicated to a pull-up pFET transistor. Plane 58 dedicated to a first internal node is analogous to internal node 25 of FIG. 1. A plane 60 dedicated to a second internal node extends horizontally within a central region 54 of cell 36 and is tied to region 56 dedicated to a pull-up pFET transistor. Plane 60 dedicated to a second internal node is also analogous to internal node 25 of FIG. 1. A plane 62 dedicated to a third internal node, smaller than the plane 60 dedicated to a second internal node, is also located with central region 54 of cell 36.

An area 70 dedicated to an output pin, analogous to output 28 of domino logic circuit 10 of FIG. 1, horizontally connects region 56 dedicated to a pull-up pFET transistor with region 50 dedicated to an inverter pFET transistor. An area 66 dedicated to a clock pin lies within central region 54 horizontally between region 46 dedicated to a clock pFET transistor and plane 40 dedicated to a clock. Area 40 dedicated to a clock can take the form of a clock channel and is reserved for a clock wire.

Area 64 dedicated to an output node vertically connects region 50 dedicated to an inverter pFET transistor with region 48 dedicated to an inverter nFET transistor. In addition, a plane 72 dedicated to a first logic tree interconnect line lies horizontally within third region 41. A plane 74 dedicated to a second logic tree interconnect line connects areas (not shown) dedicated to nFETs of the logic tree with region 44 dedicated to a clock nFET transistor.

The topology of cell 36 includes transistors grouped in strips to allow maximum source and drain connection by abutment, and a very regular transistor layout scheme for dynamic logic cells in a space-efficient and wireable fashion. The topology also provides significant noise shielding for the noise-sensitive internal nodes (i.e. 1st, 2nd, 3d internal nodes of FIG. 2) of a given dynamic logic circuit. Such noise sensitive internal nodes can be wired with a horizontal metal-on-substrate wire connecting all of the output inverter transistor gates together as well as tying into diffusions of the nFET logic tree required to perform a given logic function.

Because plane 60 dedicated to a second internal node is located on the substrate and between area 66 dedicated to a clock pin clock pin and plane 58 dedicated to a first internal node, and because a metal one (M1) layer is utilized as a horizontal wiring layer, there is no wireability loss, making it unnecessary to shield the internal node with a "do not wire here" shape. Therefore, coupling capacitance is minimized for the internal node, which is critical to the proper functioning of a dynamic logic circuit.

Cell 36 is designed to maximize layout of a library of dynamic logic cells in a space-efficient and wireable fashion. A specific design approach depends on the overall layout (i.e. whether a short, thick, or long thin cell is needed). Cell 36 utilizes standard CMOS cell design techniques, while incorporating geometric regularity and maintaining common electrical characteristics between cells of a library. In standard CMOS cell design, vertical polysilicon lines are run for each gate input. The polysilicon signals allow the maximum connection between transistors via abutting source-drain connections. These form gate segments. N-gate segments are placed close to GND and p-gate segments close to VDD. Connections to complete the gate can be made in polysilicon, metal (e.g. M1), or, where appropriate, in diffusion. The design of cell 36 keeps capacitances on internal nodes at a minimum.

In designing and laying out cell 36, the initial cell is modified to include planes reserved for specific functions. For example, plane 38 dedicated to VDD, plane 40 dedicated to a clock, and plane 42 dedicated to GND, along with plane 58 dedicated to a first internal node and plane 62 dedicated to a third internal node are based on modifications to cell 36. After outlining the cell, a designer will modify the cell to include further regions, subregions, areas and planes dedicated to specific functions or types of circuit elements. The designer will designates areas 68 dedicated to input pins of the logic tree nFETs, area 70 dedicated to an output pin, area 64 dedicated to an output node, plane 72 dedicated to a first logic tree interconnect line, plane 74 dedicated to second logic tree interconnect line, plane 60 dedicated to a second internal node, and area 64 dedicated to an output node.

An M1 layer is reserved for plane 38 dedicated to VDD, plane 40 dedicated to a clock, and plane 42 dedicated to GND, along with plane 58 dedicated to a first internal node and plane 62 dedicated to a third internal node. Areas 68 dedicated to input pins of the logic tree nFETs, area 70 dedicated to an output pin, area 64 dedicated to an output node, plane 72 dedicated to a first logic tree interconnect line, and plane 74 dedicated to second logic tree interconnect line are also reserved for the M1 layer. A metal-on-substrate or polysilicon layer is reserved for plane 60 dedicated to a second internal node, and area 64 dedicated to an output node.

In designing cell 36, the following general guidelines can be followed: Clock nFETs are placed in the lower left corner of the cell. Clock nFETs always have a connection to GND to take advantage of shared GND diffusion. Clock pFETs are placed in the upper left corner of the cell. The clock pFETs always have a connection to VDD to take advantage of shared VDD diffusion. The output inverter nFETs are placed in the lower right hand corner of the cell to take advantage of shared GND diffusion. The output pFETs are placed in the upper right hand corner of the cell to take advantage of shared VDD diffusion. The small pFET pull-up device is placed between the clock and inverter pFETs. The logic tree nFETs are placed in the region between the clock and inverter nFETs. A channel is reserved along as the top of the nFET regions as a clock prewire.

Output inverter nFETs and pFETs can be tied together with metal-on-substrate and polysilicon connections and a single M1 jumper for the internal node. The first, second and third internal node together form a single internal electrical node. The output node of the inverter pFET diffusions can also be tied together with M1, forming an interconnect and pin shape simultaneously. The internal node must sometimes be connected to the clock pFETs with M1. This shape can be placed in-line with the output pin. Since the output pin is usually long and therefore easily wired, there is little wireability lost by blocking this channel. This also guarantees access to the clock pin from above the central region should the clock prewire not be the correct phase clock for a given circuit.

The nFETs of the logic tree can be placed within the cell to share diffusions such that for the functions AND, OR, AO and OA there will never be more than two M1 wires (i.e. logic tree interconnections) needed to connect the internal nodes. These wires are placed adjacent the clock prewire channel. All input pins for the circuit are placed within the logic tree in a pyramidal fashion to guarantee that every pin will be accessible by an M1 wire clear from an edge of the cell. The noise sensitive-internal node can be wired with a horizontal metal-on-substrate wire connecting all of the output inverter transistor gates together as well as tying into whatever diffusions of the nFET logic tree are required to perform a given logic function.

While the invention has been particularly shown described with reference to a preferred embodiment, it will be understood by those skilled in the art that various changes in form and detail may be made therein without departing from the spirit and scope of the invention.

What is claimed is:

1. A cell for use in building complex integrated dynamic logic circuits, comprising:
   a plurality of regions, said plurality of regions comprising:
      a first region dedicated to a first type of integrated circuit element;
      a second region dedicated to a second type of integrated circuit element;
      a third region dedicated to one or more of a plurality of diverse types of integrated circuit elements for utilization in multiple diverse applications, wherein said cell may be utilized in conjunction with a plurality of said cells to efficiently form a complex integrated circuit device image;
   an upper edge and a lower edge;
   a plane dedicated to a ground line, said plane dedicated a ground line located horizontally along the lower edge of said cell;
   a plane dedicated to a clock line, said plane dedicated to a clock line extending horizontally along a central region of said cell;
   a plane dedicated to a voltage supply line, said plane dedicated to a voltage supply line located horizontally along the upper edge of said cell;
   said first region dedicated to a first type of integrated circuit element further comprising a first subregion dedicated to at least one n-type clock transistor, and a second subregion dedicated to at least one n-type output inverter transistor;
   said second region dedicated to a second type of integrated circuit element further comprising a first subregion dedicated to at least one p-type clock transistor, a second subregion dedicated to at least one p-type pull-up transistor, and a third subregion dedicated to at least one p-type output inverter transistor; and
   said third region dedicated to one or more of a plurality of diverse types of integrated circuit elements for utilization in multiple diverse applications, wherein said third region further comprises areas dedicated to n-type logic tree transistors having input pins and areas dedicated to input pins of said n-type logic tree transistors.

2. The cell of claim 1, wherein said cell further comprises:
   a plane dedicated to a first internal node, said plane dedicated to a first internal node horizontally connecting said first subregion dedicated to at least one p-type clock transistor with said second subregion dedicated to at least one p-type pull-up transistor;
   a plane dedicated to a second internal node, said plane dedicated to a second internal node horizontally located within said central region of said cell;
   a plane dedicated to an output pin, said plane dedicated to an output pin horizontally connecting said second subregion dedicated to at least one p-type pull-up transistor with said third subregion dedicated to at least one p-type output inverter transistor;
   a plane dedicated to a third internal node, said plane dedicated to a third internal node horizontally located within said central region of said cell;
   a plane dedicated to an output node, said plane dedicated to an output node vertically connecting said third subregion dedicated to at least one p-type output inverter transistor with said second subregion dedicated to at least one n-type output inverter;
   a plane dedicated to a clock pin, said plane dedicated to a clock pin located within said central region of said cell;
   a plane dedicated to a first logic tree interconnect, said plane dedicated to a first logic tree interconnect located within said third region dedicated to one or more of a plurality of diverse types of integrated circuit elements for utilization in multiple diverse applications;
   a plane dedicated to a second logic tree interconnect, said plane dedicated to a second logic tree interconnect connecting said third region dedicated to one or more of a plurality of diverse types of integrated circuit elements for utilization in multiple diverse applications with said first subregion dedicated at least one n-type clock transistor; and
   wherein said complex integrated dynamic logic circuits further comprise DOMINO logic circuits.

3. A cell for use in building complex integrated circuits, said cell comprising:
   a plurality of regions, said plurality of regions comprising:
      a first region dedicated to a first type of integrated circuit element, wherein said first region comprises a first subregion dedicated to at least one n-type clock transistor, and a second subregion dedicated to at least one n-type output inverter transistor;
      a second region dedicated to a second type of integrated circuit element, wherein said second region comprises a first subregion dedicated to at least one p-type clock transistor, a second subregion dedicated to at least one p-type pull-up transistor, and a third subregion dedicated to at least one p-type output inverter transistor;
      a third region dedicated to one or more of a plurality of diverse types of integrated circuit elements for utilization in multiple diverse applications, wherein said third region further comprises areas dedicated to n-type logic tree transistors having input pins and areas dedicated to input pins of said n-type logic tree transistors;
   an upper edge and a lower edge;
   a plane dedicated to a ground line, said plane dedicated to a ground line located horizontally along the lower edge of said cell;
   a plane dedicated to a clock line, said plane dedicated to a clock line extending horizontally along a central region of said cell; and
   a plane dedicated to a voltage supply line, said plane dedicated to a voltage supply line located horizontally along the upper edge of said cell, wherein said cell may be utilized in conjunction with a plurality of said cells to efficiently form a complex integrated circuit device image.

4. A cell for use in building complex integrated circuits, said cell comprising:

a plurality of regions, said plurality of regions comprising:

a first region dedicated to a first type of integrated circuit element, wherein said first region comprises a first subregion dedicated to at least one n-type clock transistor, and a second subregion dedicated to at least one n-type output inverter transistor;

a second region dedicated to a second type of integrated circuit element, wherein said second region comprises a first subregion dedicated to at least one p-type clock transistor, a second subregion dedicated to at least one p-type pull-up transistor, and a third subregion dedicated to at least one p-type output inverter transistor;

a third region dedicated to one or more of a plurality of diverse types of integrated circuit elements for utilization in multiple diverse applications, wherein said third region further comprises areas dedicated to n-type logic tree transistors having input pins and areas dedicated to input pins of said n-type logic tree transistors;

an upper edge and a lower edge a plane dedicated to a ground line, said plane dedicated to a ground line located horizontally along the lower edge of said cell;

a plane dedicated to a clock line, said plane dedicated to a clock line extending horizontally along a central region of said cell;

a plane dedicated to a voltage supply line, said plane dedicated to a voltage supply line located horizontally along the upper edge of said cell, wherein said cell may be utilized in conjunction with a plurality of said cells to efficiently form a complex integrated circuit device image;

a plane dedicated to a first internal node, said plane dedicated to a first internal node horizontally connecting said first subregion dedicated to at least one p-type clock transistor with said second subregion dedicated to at least one p-type pull-up transistor;

a plane dedicated to a second internal node, said plane dedicated to a second internal node horizontally located within said central region of said cell;

a plane dedicated to an output pin, said plane dedicated to an output pin horizontally connecting said second subregion dedicated to at least one p-type pull-up transistor with said third subregion dedicated to at least one p-type output inverter transistor;

a plane dedicated to a third internal node, said plane dedicated to a third internal node horizontally located within said central region of said cell;

a plane dedicated to an output node, said plane dedicated to an output node vertically connecting said third subregion dedicated to at least one p-type output inverter transistor with said second subregion dedicated to at least one n-type output inverter;

a plane dedicated to a clock pin, said plane dedicated to a clock pin located within said central region of said cell;

a plane dedicated to a first logic tree interconnect, said plane dedicated to a first logic tree interconnect located within said third region dedicated to one or more of a plurality of diverse types of integrated circuit elements for utilization in multiple diverse applications; and a plane dedicated to a second logic tree interconnect, said plane dedicated to a second logic tree interconnect connecting said third region dedicated to one or more of a plurality of diverse types of integrated circuit elements for utilization in multiple diverse applications with said first subregion dedicated at least one n-type clock transistor.

5. The cell of claim 4 wherein said complex integrated circuits further comprises complex integrated dynamic logic circuits.

6. The cell of claim 5 wherein said complex integrated dynamic logic circuits further comprise complex integrated DOMINO logic circuits.

* * * * *